United States Patent
Nakagawa

(10) Patent No.: US 10,298,205 B2
(45) Date of Patent: May 21, 2019

(54) ELASTIC WAVE RESONATOR, ELASTIC WAVE FILTER, AND DUPLEXER

(71) Applicant: Murata Manufacturing Co., Ltd., Nagaokakyo-shi, Kyoto-fu (JP)

(72) Inventor: Ryo Nakagawa, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/679,321

(22) Filed: Aug. 17, 2017

(65) Prior Publication Data

US 2017/0366167 A1    Dec. 21, 2017

Related U.S. Application Data

(63) Continuation of application No. PCT/JP2016/054466, filed on Feb. 16, 2016.

(30) Foreign Application Priority Data

Mar. 27, 2015 (JP) ................. 2015-066849

(51) Int. Cl.
*H03H 9/145* (2006.01)
*H03H 9/25* (2006.01)
(Continued)

(52) U.S. Cl.
CPC ............. *H03H 9/64* (2013.01); *H03H 9/145* (2013.01); *H03H 9/1457* (2013.01); *H03H 9/25* (2013.01); *H03H 9/725* (2013.01)

(58) Field of Classification Search
CPC ............. H03H 9/02818; H03H 9/145; H03H 9/14552; H03H 9/1457; H03H 9/25; H03H 9/64; H03H 9/725
(Continued)

(56) References Cited

U.S. PATENT DOCUMENTS

| 2002/0000898 A1 | 1/2002 | Takamine |
| 2011/0199163 A1 | 8/2011 | Yamanaka |
| 2012/0105165 A1* | 5/2012 | Yamanaka ......... H03H 9/02551 331/158 |

FOREIGN PATENT DOCUMENTS

| JP | 02-127809 A | 5/1990 |
| JP | 08-298432 A | 11/1996 |

(Continued)

OTHER PUBLICATIONS

English language machine translation of JP 2007-013414 A, published Jan. 18, 2007, 6 pages.*

(Continued)

*Primary Examiner* — Barbara Summons
(74) *Attorney, Agent, or Firm* — Keating & Bennett, LLP

(57) ABSTRACT

An elastic wave resonator including a piezoelectric substrate and an IDT electrode, the IDT electrode includes a first electrode finger and a second electrode finger arranged next to the first electrode finger; when $W_1$ is the width of the first electrode finger, $W_2$ is the width of the second electrode finger, and L is a pitch or an electrode finger center distance between the first electrode finger and the second electrode finger; a metallization ratio ($W_1/L$) of the first electrode finger is smaller than a metallization ratio ($W_2/L$) of the second electrode finger; a sum ($W_1/L+W_2/L$) of the metallization ratio of the first electrode finger and the metallization ratio of the second electrode finger is between about 0.65 and about 1.00 inclusive, and a ratio ($W_2/W_1$) between a width of the first electrode finger and a width of the second electrode finger is between about 1.12 and about 2.33 inclusive, or $W_1/L+W_2/L$ is larger than about 1.00, and $W_2/W_1$ is between about 1.40 and about 2.34 inclusive.

19 Claims, 5 Drawing Sheets

(51) Int. Cl.
*H03H 9/64* (2006.01)
*H03H 9/72* (2006.01)

(58) Field of Classification Search
USPC .......... 333/133, 193–196; 310/313 B, 313 D
See application file for complete search history.

(56) References Cited

FOREIGN PATENT DOCUMENTS

| | | | |
|---|---|---|---|
| JP | 09-205339 A | | 8/1997 |
| JP | 2004-112591 A | | 4/2004 |
| JP | 2007-013414 A | * | 1/2007 |
| JP | 5177230 B2 | | 4/2013 |
| KR | 10-0434413 B1 | | 6/2004 |

OTHER PUBLICATIONS

Official Communication issued in International Patent Application No. PCT/JP2016/054466, dated May 10, 2016.

* cited by examiner

ELASTIC WAVE RESONATOR, ELASTIC WAVE FILTER, AND DUPLEXER

CROSS REFERENCE TO RELATED APPLICATIONS

This application claims the benefit of priority to Japanese Patent Application No. 2015-066849 filed on Mar. 27, 2015 and is a Continuation Application of PCT Application No. PCT/JP2016/054466 filed on Feb. 16, 2016. The entire contents of each application are hereby incorporated herein by reference.

BACKGROUND OF THE INVENTION

1. Field of the Invention

The present invention relates to an elastic wave resonator including an IDT electrode that is mounted on a piezoelectric substrate, and to an elastic wave filter and a duplexer each including such an elastic wave resonator.

2. Description of the Related Art

Elastic wave resonators have been widely used as resonators for band filters to be used in cellular phones and the like. For example, in Japanese Unexamined Patent Application Publication No. 2-127809, an elastic wave resonator including a piezoelectric substrate and an interdigital transducer (IDT) electrode mounted on the piezoelectric substrate is disclosed. Japanese Unexamined Patent Application Publication No. 2-127809 describes a structure where electrode fingers having different widths are arranged at intervals within the IDT electrode.

However, as in the elastic wave resonator of the Japanese Unexamined Patent Application Publication No. 2-127809, even in cases where electrode fingers having different widths are arranged at intervals within the IDT electrode, depending on values of the different widths of the electrode fingers, non-linear signals are not sufficiently reduced in some cases. Therefore, when the elastic wave resonator of the Japanese Unexamined Patent Application Publication No. 2-127809 is used in a transmission filter of a duplexer, in some cases, noise in a reception band of the duplexer increases, and reception sensitivity decreases.

SUMMARY OF THE INVENTION

Preferred embodiments of the present invention provide elastic wave resonators that enable sufficient reduction or prevention of non-linear signal generation without increasing an area of the IDT electrode. Preferred embodiments of the present invention also provide an elastic wave filter and a duplexer each including such an elastic wave resonator.

An elastic wave resonator according to a preferred embodiment of the present invention includes a piezoelectric substrate; and an IDT electrode provided on the piezoelectric substrate, wherein the IDT electrode includes a first electrode finger and a second electrode finger, the second electrode finger being adjacent to the first electrode finger in an elastic wave propagation direction; a metallization ratio ($W_1/L$) of the first electrode finger is smaller than a metallization ratio ($W_2/L$) of the second electrode finger; a sum ($W_1/L+W_2/L$) of the first metallization ratio and the second metallization ratio is between about 0.65 and about 1.00 inclusive, and a ratio ($W_2/W_1$) between a width of the first electrode finger and a width of the second electrode finger is between about 1.12 and about 2.33 inclusive, or the sum ($W_1/L+W_2/L$) of the first metallization ratio and the second metallization ratio is larger than about 1.00, and the ratio ($W_2/W_1$) between the width of the first electrode finger and the width of the second electrode finger is between about 1.40 and about 2.34 inclusive, where $W_1$ is the width of the first electrode finger along the elastic wave propagation direction, $W_2$ is the width of the second electrode finger along the elastic wave propagation direction, and L is a pitch or an electrode finger center distance between the first electrode finger and the second electrode finger.

In a preferred embodiment of an elastic wave resonator according to the present invention, preferably the sum ($W_1/L+W_2/L$) of the first metallization ratio and the second metallization ratio is larger than about 0.70 but equal to or smaller than about 1.00, and a ratio ($W_2/W_1$) between the width of the first electrode finger and the width of the second electrode finger is between about 1.14 and about 2.33 inclusive, or the sum ($W_1/L+W_2/L$) of the first metallization ratio and the second metallization ratio is larger than about 1.00, and the ratio ($W_2/W_1$) between the width of the first electrode finger and the width of the second electrode finger is between about 1.40 and about 2.34 inclusive. In this case, the generation of non-linear signal is able to be reduce or prevented while achieving downsizing.

In another preferred embodiment of an elastic wave resonator according to the present invention, the IDT electrode preferably includes a plurality of the first electrode fingers and a plurality of the second electrode fingers, and the first electrode finger and the second electrode finger are alternately arranged along the elastic wave propagation direction.

In another preferred embodiment of an elastic wave resonator according to the present invention, the IDT electrode preferably includes a plurality of the first electrode fingers and a plurality of the second electrode fingers, and an adjacent pair of the first electrode fingers and an adjacent pair of the second electrode fingers are alternately arranged along the elastic wave propagation direction.

An elastic wave filter according to a preferred embodiment of the present invention includes a plurality of elastic wave resonators, wherein, of the plurality of elastic wave resonators, at least one elastic wave resonator is the elastic wave resonator configured according to a preferred embodiment of the present invention described above.

A duplexer according to a preferred embodiment of the present invention includes a plurality of elastic wave resonators, the duplexer including a bandpass-type first filter and a second filter whose passband is different from that of the first filter, wherein, of a plurality of elastic wave resonators in at least one of the first filter and the second filter, at least one elastic wave resonator is the elastic wave resonator configured according to a preferred embodiment of the present invention described above.

As described above, in the elastic wave resonators according to preferred embodiments of the present invention, the metallization ratios of the first electrode finger and the second electrode finger and the ratio between the widths of the first electrode finger and the second electrode finger are limited to specific ranges. Therefore, the generation of non-linear signal is sufficiently reduced or prevented without increasing the area of the IDT electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter the present invention is disclosed in detail by describing specific preferred embodiments of the present invention with reference to the drawings.

Each preferred embodiment described in the present specification is for illustrative purposes only, and elements of different preferred embodiments may be partially exchanged or combined.

First Preferred Embodiment

Figure 1:
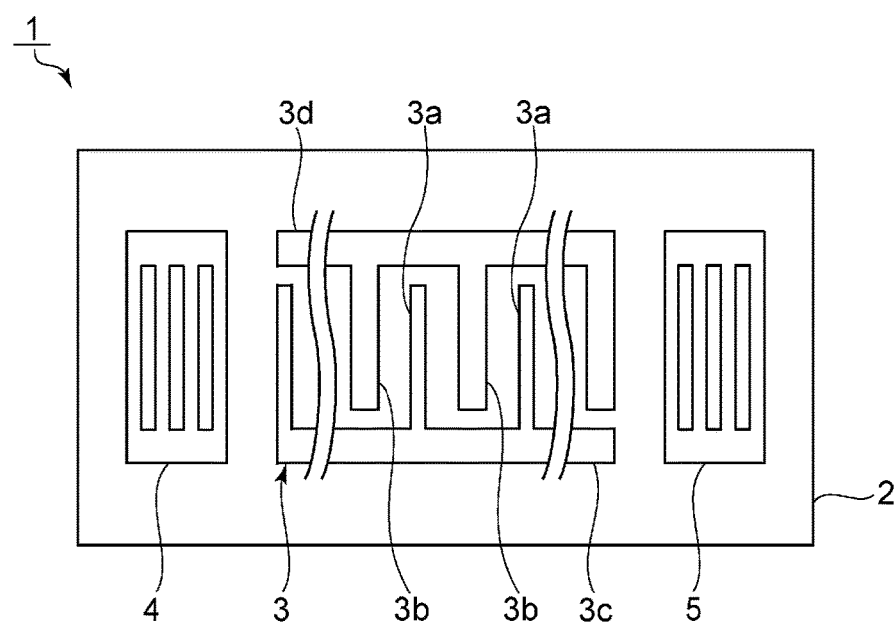
FIG. 1 is a schematic plan view of an elastic wave resonator according to a first preferred embodiment of the present invention.
Figure 2:
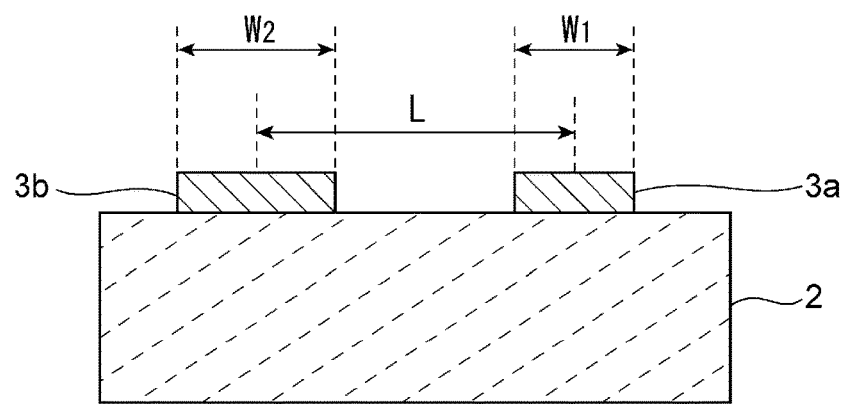
FIG. 2 is a schematic front-side cross-sectional view illustrating an expanded view of a portion where a first electrode finger and a second electrode finger are arranged adjacent to each other in an elastic wave device according to the first preferred embodiment of the present invention.

FIG. 1 is a schematic plan view of an elastic wave resonator according to a first preferred embodiment of the present invention. FIG. 2 is a schematic front-side cross-sectional view illustrating an expanded view of a portion where a first electrode finger and a second electrode finger are arranged adjacent to each other in an elastic wave device according to the first preferred embodiment of the present invention.

An elastic wave resonator 1 includes a piezoelectric substrate 2. The piezoelectric substrate 2 is a substrate preferably made of $LiTaO_3$, for example. Alternatively, the piezoelectric substrate 2 may be a substrate made of another piezoelectric single crystal, such as $LiNbO_3$ or other suitable piezoelectric material, or may be a substrate made of piezoelectric ceramics, for example.

As illustrated in FIG. 1, an IDT electrode 3 and reflectors 4 and 5 are provided on the piezoelectric substrate 2, and the reflectors 4 and 5 are respectively arranged at two sides of the IDT electrode 3 in an elastic wave propagation direction. In this manner, a one-port type elastic wave resonator is provided.

The IDT electrode 3 is preferably made of any suitable metal such as Al, Cu, Ni, Ti, Pt, NiCr, AlCu, or an alloy containing at least one of those metals. The IDT electrode 3 may be a single layer of a metal film or a multi-layered metal film in which two or more types of metals or alloys are stacked on top of each other.

The IDT electrode 3 includes a plurality of first electrode fingers 3a, a plurality of second electrode fingers 3b, a first busbar 3c, and a second busbar 3d.

The plurality of first electrode fingers 3a and the plurality of second electrode fingers 3b are arranged in an alternating manner along the elastic wave propagation direction. The elastic wave propagation direction is a direction perpendicular or substantially perpendicular to a direction in which the electrode fingers extend.

In the present preferred embodiment, the plurality of first electrode fingers 3a and the plurality of second electrode fingers 3b are mutually interposed. End portions of the plurality of first electrode fingers 3a are connected to the first busbar 3c. End portions of the plurality of second electrode fingers 3b are connected to the second busbar 3d.

In the present preferred embodiment, the IDT electrode includes only the first electrode fingers 3a and the second electrode fingers 3b, and does not include any other electrode fingers. However, according to preferred embodiments of the present invention, all that is required is that at least some of electrode fingers within the IDT electrode 3 are the first electrode finger 3a and the second electrode finger 3b. In other words, all that is required is that, in the elastic wave propagation direction, at least in a portion, a region is provided in which the first electrode finger 3a and the second electrode finger 3b are alternately arranged.

In preferred embodiments of the present invention, it is preferable that, of all the electrode fingers, 50% or more of the electrode fingers define the region where the first electrode finger 3a and the second electrode finger 3b are alternately arranged. It is more preferable that, as in the present preferred embodiment, all of the first electrode fingers 3a and the second electrode fingers 3b are arranged in an alternating manner along the elastic wave propagation direction. As the ratio of the region in which the first electrode finger 3a and the second electrode finger 3b are alternately arranged increases, the generation of a non-linear signal, which will be described below, is able to be more effectively reduced or prevented.

A metallization ratio of the first electrode finger 3a is smaller than a metallization ratio of the second electrode finger 3b.

As illustrated in FIG. 2, the metallization ratio of the first electrode finger 3a is represented by $W_1/L$, where $W_1$ is the width of the first electrode finger 3a, and L is a pitch or an electrode finger center distance between the first electrode finger 3a and the second electrode finger 3b. The metallization ratio of the second electrode finger 3b is represented by $W_2/L$ where $W_2$ is the width of the second electrode finger 3b. Here, $W_1$ is smaller than $W_2$.

In the present preferred embodiment, preferably a sum $(W_1/L+W_2/L)$ of the metallization ratio of the first electrode finger 3a and the metallization ratio of the second electrode finger 3b is between about 0.65 and about 1.00 inclusive, and a ratio $(W_2/W_1)$ between the width of the first electrode finger 3a and the width of the second electrode finger 3b is between about 1.12 and about 2.33 inclusive, for example. Alternatively, $(W_1/L+W_2/L)$ is preferably larger than about 1.00, and $(W_2/W_1)$ is between about 1.40 and about 2.34 inclusive, for example.

In preferred embodiments of the present invention, the generation of a non-linear signal is sufficiently reduce or prevented by setting the sum $(W_1/L+W_2/L)$ of the metallization ratios and the ratio $(W_2/W_1)$ between the electrode finger widths at the ranges described above and by making to satisfy $W_1/L<W_2/L$. This will be described in detail with reference to an experimental example below.

Experimental Example

In the experimental example, one-port type elastic wave resonators 1 were fabricated with the following conditions. In the experimental example, the elastic wave resonators 1 whose resonant frequency in the fundamental mode was about 839 MHz were fabricated.

Piezoelectric substrate 2: 42° YX—LiTaO$_3$

IDT electrode 3: Ti/AlCu (layered in the order of Ti and AlCu)

Number of pairs of electrode finger: 80 pairs

In the experimental example, samples were fabricated while changing $W_1/L$ and $W_2/L$, which are the metallization ratio of the first electrode finger 3a and the metallization ratio of the second electrode finger 3b, within the range of about 0.3 to about 0.7, as indicated in Table 1. Specifically, by changing the combination of $W_1/L$ and $W_2/L$, samples indicated in Table 1, A1 to A8, B1 to B7, C1 to C6, D1 to D5, E1 to E4, F1 to F3, G1 to G2, and H1 were fabricated.

TABLE 1

| | | $W_2/L$ | | | | | | |
|---|---|---|---|---|---|---|---|---|
| | 0.3 | 0.35 | 0.4 | 0.45 | 0.5 | 0.55 | 0.6 | 0.7 |
| $W_1/L$ 0.3 | A1 | A2 | A3 | A4 | A5 | A6 | A7 | A8 |
| 0.35 | — | B1 | B2 | B3 | B4 | B5 | B6 | B7 |
| 0.4 | — | — | C1 | C2 | C3 | C4 | C5 | C6 |
| 0.45 | — | — | — | D1 | D2 | D3 | D4 | D5 |
| 0.5 | — | — | — | — | E1 | E2 | E3 | E4 |
| 0.55 | — | — | — | — | — | F1 | F2 | F3 |
| 0.6 | — | — | — | — | — | — | G1 | G2 |
| 0.7 | — | — | — | — | — | — | — | H1 |

TABLE 2

| | | $W_2/L$ | | | | | | |
|---|---|---|---|---|---|---|---|---|
| | 0.3 | 0.35 | 0.4 | 0.45 | 0.5 | 0.55 | 0.6 | 0.7 |
| $W_1/L$ 0.3 | 4.76 | 4.73 | 4.71 | 4.695 | 4.68 | 4.665 | 4.66 | 4.655 |
| 0.35 | — | 4.71 | 4.69 | 4.67 | 4.655 | 4.645 | 4.635 | 4.63 |
| 0.4 | — | — | 4.67 | 4.65 | 4.635 | 4.625 | 4.615 | 4.61 |
| 0.45 | — | — | — | 4.63 | 4.62 | 4.605 | 4.595 | 4.59 |
| 0.5 | — | — | — | — | 4.6 | 4.59 | 4.58 | 4.575 |
| 0.55 | — | — | — | — | — | 4.575 | 4.565 | 4.56 |
| 0.6 | — | — | — | — | — | — | 4.555 | 4.55 |
| 0.7 | — | — | — | — | — | — | — | 4.545 |

TABLE 3

| | | $W_2/L$ | | | | | | |
|---|---|---|---|---|---|---|---|---|
| | 0.3 | 0.35 | 0.4 | 0.45 | 0.5 | 0.55 | 0.6 | 0.7 |
| $W_1/L$ 0.3 | 130 | 125 | 120 | 115 | 112 | 109 | 105 | 98 |
| 0.35 | — | 125 | 117 | 114 | 110 | 106 | 102 | 92 |
| 0.4 | — | — | 115 | 111 | 107 | 103 | 99 | 89 |
| 0.45 | — | — | — | 107 | 102 | 100 | 97 | 88 |
| 0.5 | — | — | — | — | 100 | 95 | 92 | 85 |
| 0.55 | — | — | — | — | — | 93 | 90 | 82 |
| 0.6 | — | — | — | — | — | — | 87 | 80 |
| 0.7 | — | — | — | — | — | — | — | 74 |

TABLE 4

| | | $W_2/L$ | | | | | | |
|---|---|---|---|---|---|---|---|---|
| | 0.3 | 0.35 | 0.4 | 0.45 | 0.5 | 0.55 | 0.6 | 0.7 |
| $W_1/L$ 0.3 | 1 | 1.166667 | 1.333333 | 1.5 | 1.666667 | 1.833333 | 2 | 2.333333 |
| 0.35 | — | 1 | 1.142857 | 1.285714 | 1.428571 | 1.571429 | 1.714286 | 2 |
| 0.4 | — | — | 1 | 1.125 | 1.25 | 1.375 | 1.5 | 1.75 |
| 0.45 | — | — | — | 1 | 1.111111 | 1.222222 | 1.333333 | 1.555556 |
| 0.5 | — | — | — | — | 1 | 1.1 | 1.2 | 1.4 |
| 0.55 | — | — | — | — | — | 1 | 1.090909 | 1.272727 |
| 0.6 | — | — | — | — | — | — | 1 | 1.166667 |
| 0.7 | — | — | — | — | — | — | — | 1 |

A wavelength and an intersecting width of each sample were adjusted such that characteristics of the samples were equal or substantially equal. The wavelength of each adjusted sample is indicated in Table 2, and the intersecting width of the adjusted sample is indicated in Table 3. Further, the ratio ($W_2/W_1$) of the electrode finger widths of each sample is indicated in Table 4, and the sum ($W_1/L+W_2/L$) of the metallization ratios of each sample is indicated in Table 5. Note that the area of the IDT electrode 3 decreases as the value of the sum ($W_1/L+W_2/L$) of the metallization ratios in Table 5 increases. This is because an electrostatic capacity per electrode finger increases as the metallization ratio increases, and it is desirable to reduce the intersecting width in order to design the IDT electrode 3 with the same or substantially the same impedance.

TABLE 5

| | | $W_2/L$ | | | | | | |
|---|---|---|---|---|---|---|---|---|
| | 0.3 | 0.35 | 0.4 | 0.45 | 0.5 | 0.55 | 0.6 | 0.7 |
| $W_1/L$ 0.3 | 0.6 | 0.65 | 0.7 | 0.75 | 0.8 | 0.85 | 0.9 | 1 |
| 0.35 | — | 0.7 | 0.75 | 0.8 | 0.85 | 0.9 | 0.95 | 1.05 |
| 0.4 | — | — | 0.8 | 0.85 | 0.9 | 0.95 | 1 | 1.1 |
| 0.45 | — | — | — | 0.9 | 0.95 | 1 | 1.05 | 1.15 |
| 0.5 | — | — | — | — | 1 | 1.05 | 1.1 | 1.2 |
| 0.55 | — | — | — | — | — | 1.1 | 1.15 | 1.25 |
| 0.6 | — | — | — | — | — | — | 1.2 | 1.3 |
| 0.7 | — | — | — | — | — | — | — | 1.4 |

In the present experimental example, $W_1/L$ and $W_2/L$ of each sample were varied, and a peak value of a third harmonic was measured. The results are indicated in Table 6. Note that the values of Table 6 are all under the same impedance, and the wavelength and the intersecting width of the IDT electrode 3 were adjusted so as to have the same or substantially the same characteristics in each sample. Here, samples that satisfy $W_1/L=W_2/L$ are assumed to be standard samples (A1, B1, C1, D1, E1, F1, G1, and H1 in Table 1).

TABLE 6

| | | \multicolumn{8}{c}{$W_2/L$} | | | | | | | |
|---|---|---|---|---|---|---|---|---|---|
| | | 0.3 | 0.35 | 0.4 | 0.45 | 0.5 | 0.55 | 0.6 | 0.7 |
| $W_1/L$ | 0.3 | −110.02 | −110.521 | −112.994 | −117.28 | −120.194 | −118.334 | −115.933 | −106.766 |
| | 0.35 | — | −116.118 | −116.608 | −119.259 | −116.715 | −114.341 | −110.628 | −107.458 |
| | 0.4 | — | — | −117.865 | −113.468 | −110.54 | −109.999 | −106.582 | −110.912 |
| | 0.45 | — | — | — | −109.732 | −107.005 | −105.974 | −103.885 | −108.508 |
| | 0.5 | — | — | — | — | −104.489 | −103.689 | −101.81 | −101.035 |
| | 0.55 | — | — | — | — | — | −101.945 | −100.334 | −96.775 |
| | 0.6 | — | — | — | — | — | — | −99.249 | −94.52 |
| | 0.7 | — | — | — | — | — | — | — | −88.19 |

From Table 5 and Table 6, it was discovered that, when a sample is compared with a standard sample having a smaller area of the IDT electrode than the sample itself, $W_1/L+W_2/L$ was substantially equal to or larger than that of the standard sample, and that the peak value of the third harmonic was improved in the following samples that satisfy $W_1/L \neq W_2/L$ and $W_1/L<W_2/L$ compared with some of the standard samples.

Specifically, in the samples indicated in Table 1, A2 to A8, B2 to B7, C2 to C6, D3, D5, and E4, the peak value of the third harmonic was improved compared with some of the standard samples.

In other words, it was discovered that, compared with some of the standard samples, the peak value of the third harmonic was improved in the sample whose $W_1/L+W_2/L$ was between about 0.65 and about 1.00 inclusive and $W_2/W_1$ was between about 1.12 and about 2.33 inclusive while satisfying $W_1/L<W_2/L$.

Alternatively, it is also found that, compared with some of the standard samples, the peak value of the third harmonic was improved in the sample whose $W_1/L+W_2/L$ was larger than about 1.00 and $W_2/W_1$ was between about 1.40 and about 2.34 inclusive while satisfying $W_1/L<W_2/L$.

Figure 3:
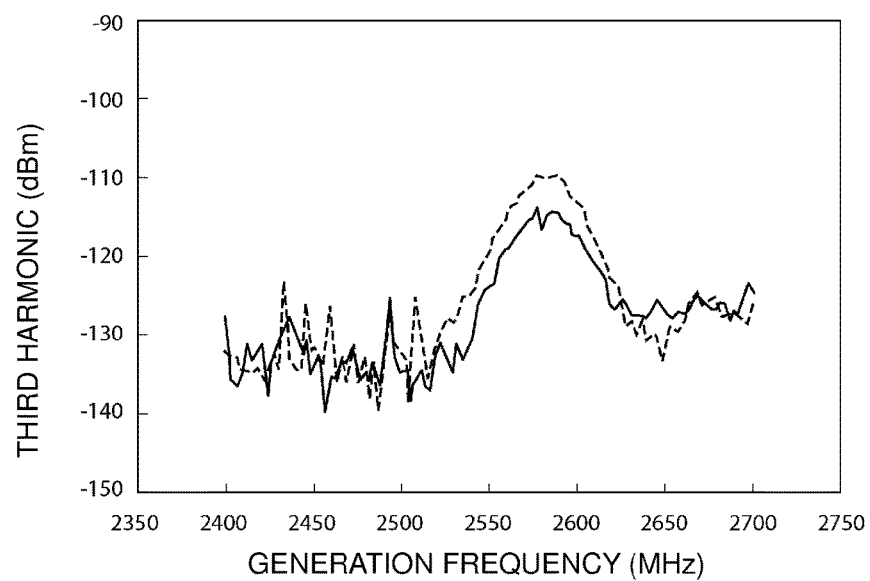
FIG. 3 is a diagram illustrating characteristics of a third harmonic of an elastic wave device fabricated in an experiment example.

FIG. 3 is a diagram illustrating characteristics of the third harmonic of an elastic wave device fabricated in the experimental example. In the drawing, a solid line represents a result of B5 ($W_1/L=0.35$, $W_2/L=0.55$) in Table 1. A dashed line represents a result of D1 ($W_1/L=W_2/L=0.45$) in Table 1.

From FIG. 3, it was discovered that, in B5, the peak value of the third harmonic (frequency: peak value near 2580 MHz) was improved by about 5 dB compared with the standard sample D1.

Figure 4:
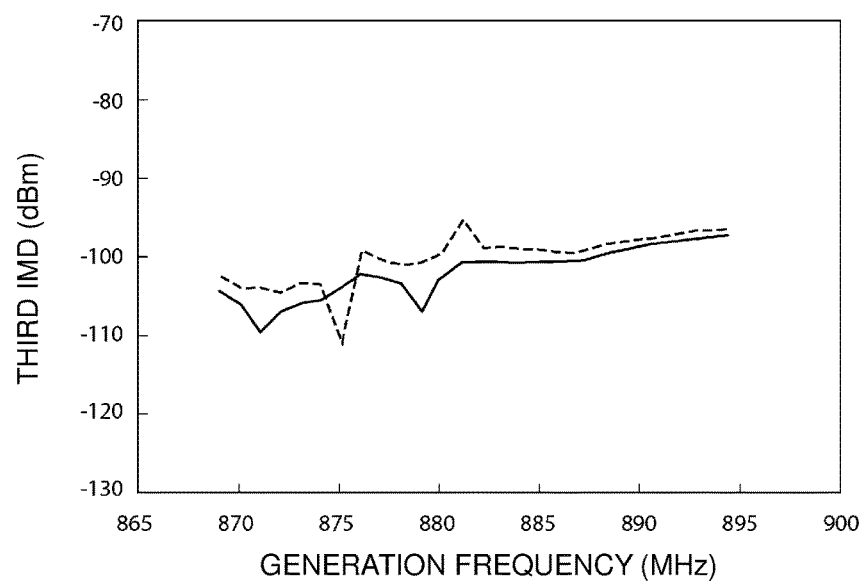
FIG. 4 is a diagram illustrating characteristics of a third order intermodulation distortion (IMD) of an elastic wave device fabricated in an experiment example.

FIG. 4 is a diagram illustrating characteristics of third IMD of the elastic wave device fabricated in the experimental example. In the drawing, a solid line represents a result of B5 ($W_1/L=0.35$, $W_2/L=0.55$) in Table 1. A dashed line represents a result of D1 ($W_1/L=W_2/L=0.45$) in Table 1.

From FIG. 4, it is found that, in B5, a level of third IMD (frequency: third IMD in a frequency band between 870 to 895 MHz) was improved by about 1 to 5 dB compared with the standard sample D1. Although the level of third IMD deteriorates at 875 MHz compared with the standard sample, this is an effect of secondary mode and not an essential issue. In terms of peak value, from FIG. 4, it was discovered that, in B5, a peak level of the third IMD (near 881 MHz) was improved by about 4 dB compared with the standard sample D1.

As described above, despite the fact that the sum of the metallization ratios is the same or substantially the same in B5 and the standard sample D1, namely, despite the fact that the area of the IDT electrode 3 is the same in B5 and the standard sample D1, a difference in characteristic improvement was recognized.

It is considered that, when the widths of the electrode fingers are different as in B5, phases of the non-linear signals generated at respective electrode fingers are different from each other, and this results in cancellation, which reduces the level of the non-linear signals.

Returning to Table 6, in the samples A4 to A8, B2 to B7, C3 to C6, D3, D5, and E4 indicated in Table 1, it was discovered that the peak value of third harmonic was improved compared with a corresponding standard sample whose $W_1/L+W_2/L$ is substantially equal to or smaller.

In other words, in the sample whose $W_1/L+W_2/L$ is larger than about 0.7 but equal to or smaller than about 1.00, whose $W_2/W_1$ is between about 1.14 and about 2.33 inclusive, and that satisfies $W_1/L<W_2/L$, it was discovered that the peak value of the third harmonic was improved compared with a corresponding standard sample whose $W_1/L+W_2/L$ is substantially equal to or smaller.

Alternatively, in the sample whose $W_1/L+W_2/L$ is larger than about 1.00, whose $W_2/W_1$ is between about 1.40 and about 2.34 inclusive, and that satisfies $W_1/L<W_2/L$, it was discovered that the peak value of the third harmonic was improved compared with a corresponding standard sample whose $W_1/L+W_2/L$ is substantially equal to or smaller.

For example, it was discovered that, in A4 ($W_1/L=0.3$, $W_2/L=0.45$), the peak value of the third harmonic was improved by about 1.1 dB compared with the standard sample B1 ($W_1/L=W_2/L=0.35$).

The larger $W_1/L+W_2/L$ is, the smaller the area of the IDT electrode 3 becomes. Thus, it is understandable that the peak value of the third harmonic was improved in A4 despite having the smaller area than that of the standard sample B1.

It was also discovered that, in E4 ($W_1/L=0.5$, $W_2/L=0.7$), the peak value of third harmonic was improved by about 1.8 dB compared with the standard sample G1 ($W_1/L=W_2/L=0.6$). It was discovered that the peak value of the third harmonic was improved in E4 despite having an area equal or substantially equal to that of the standard sample G1.

Accordingly, by setting $W_1/L+W_2/L$ and $W_2/W_1$ ($W_1/L<W_2/L$) within the ranges described above, the generation of a non-linear signal is able to be sufficiently reduced or prevented without increasing the size.

Thus, in the present invention, it is preferable that $W_1/L+W_2/L$ is larger than about 0.70 but equal to or smaller than about 1.00 and $W_2/W_1$ ($W_1/L<W_2/L$) is between about 1.14 and about 2.33 inclusive. Alternatively, it is also preferable that $W_1/L+W_2/L$ is larger than about 1.00 and $W_2/W_1$ is between about 1.40 and about 2.34 inclusive.

Second Preferred Embodiment

Figure 5:
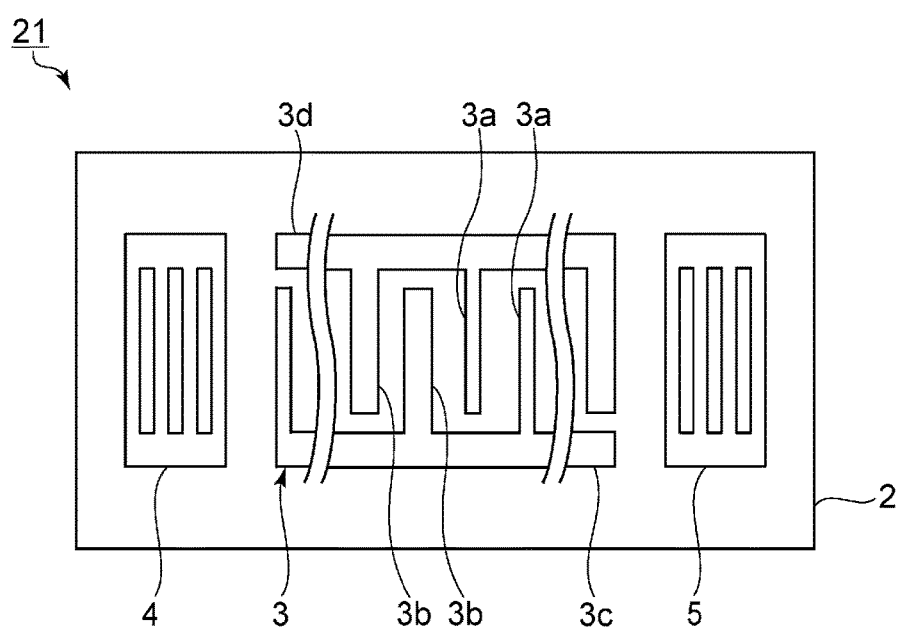
FIG. 5 is a schematic plan view of an elastic wave resonator according to a second preferred embodiment of the present invention.

FIG. 5 is a schematic plan view of an elastic wave resonator according to a second preferred embodiment of the present invention. As illustrated in FIG. 5, in an elastic wave resonator 21, an adjacent pair of first electrode fingers 3a and 3a and an adjacent pair of second electrode fingers 3b and 3b are alternately arranged along an elastic wave propagation direction.

A plurality of the first electrode fingers 3a and a plurality of the second electrode fingers 3b, are mutually interposed. The plurality of the first or second electrode fingers 3a, 3b is connected to a first busbar 3c. The plurality of the first or second electrode fingers 3a, 3b is connected to a second busbar 3d.

In the elastic wave resonator 21, all of the electrode fingers consist of the adjacent pair of first electrode fingers 3a and 3a and the adjacent pair of second electrode fingers 3b and 3b. The adjacent pair of first electrode fingers 3a and 3a and the adjacent pair of second electrode fingers 3b and 3b are alternately arranged along the elastic wave propagation direction.

However, in preferred embodiments of the present invention, all that is required is to have a region in which the adjacent pair of first electrode fingers 3a and 3a and the adjacent pair of second electrode fingers 3b and 3b are alternately arranged on a periodic basis at least in a portion of the IDT electrode 3.

It is preferable that, of all the electrode fingers, 50% or more of the electrode fingers consist of the adjacent pairs of first electrode fingers 3a and 3a and the adjacent pairs of second electrode fingers 3b and 3b. It is more preferable that, as in the present preferred embodiment, all of the electrode fingers consist of the adjacent pairs of first electrode fingers 3a and 3a and the adjacent pairs of second electrode fingers 3b and 3b. The larger the ratio of such electrode fingers is, the more completely the generation of a non-linear signal, which will be described below, is able to be reduced or prevented. The remaining portions are similar to those of the first preferred embodiment.

In the elastic wave resonator 21, the metallization ratio ($W_1/L$) of the first electrode finger 3a is preferably smaller than the metallization ratio ($W_2/L$) of the second electrode finger 3b. Furthermore, $W_1<W_2$.

Furthermore, preferably, the sum ($W_1/L+W_2/L$) of the metallization ratio of the first electrode finger 3a and the metallization ratio of the second electrode finger 3b is between about 0.65 and about 1.00 inclusive, and the ratio ($W_2/W_1$) between the width of the first electrode finger 3a and the width of the second electrode finger 3b is between about 1.12 and about 2.33 inclusive, for example.

Alternatively, $W_1/L+W_2/L$ is preferably larger than about 1.00, and $W_2/W_1$ is preferably between about 1.40 and about 2.34 inclusive, for example. Accordingly, even with the elastic wave resonator 21, the generation of a non-linear signal is sufficiently reduced or prevented.

Furthermore, it is preferable that $W_1/L+W_2/L$ is larger than about 0.70 but equal to or smaller than about 1.00, and $W_2/W_1$ is between about 1.14 and about 2.33 inclusive, for example. This enables sufficient reduction or prevention of the generation of a non-linear signal without increasing the size.

Figure 6:
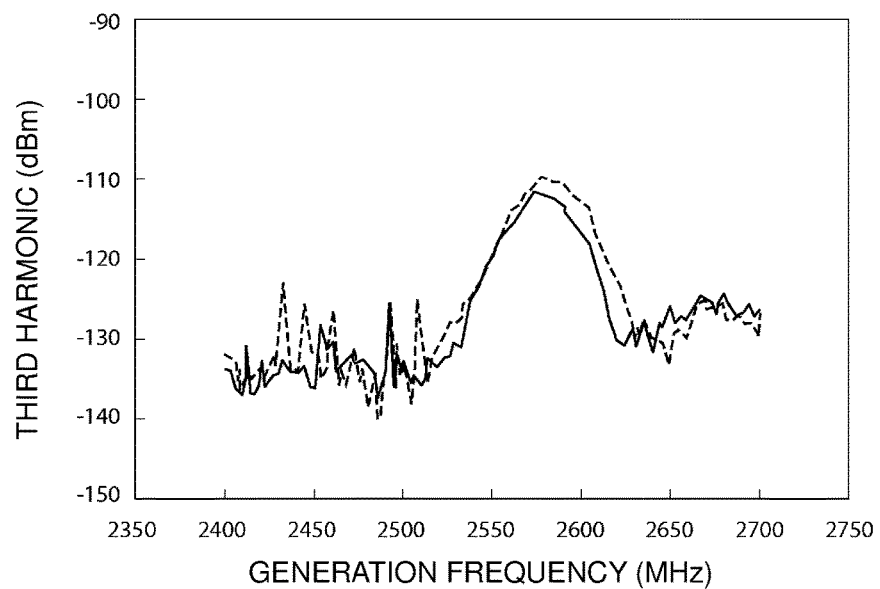
FIG. 6 is a diagram illustrating characteristics of a third harmonic of an elastic wave resonator according to the second preferred embodiment of the present invention.

FIG. 6 is a diagram illustrating characteristics of the third harmonic of an elastic wave resonator according to the second preferred embodiment. In FIG. 6, a solid line represents a result with the elastic wave resonator 21 when $W_1/L=0.35$ and $W_2/L=0.55$. A dashed line represents a result with the elastic wave resonator 21 when $W_1/L=W_2/L=0.45$).

From FIG. 6, when $W_1/L=0.35$ and $W_2/L=0.55$, as in the first preferred embodiment, it was discovered that the peak value of the third harmonic (frequency: peak value near 2580 MHz) was improved by about 2 dB compared with the standard sample of $W_1/L=W_2/L=0.45$.

Figure 7:
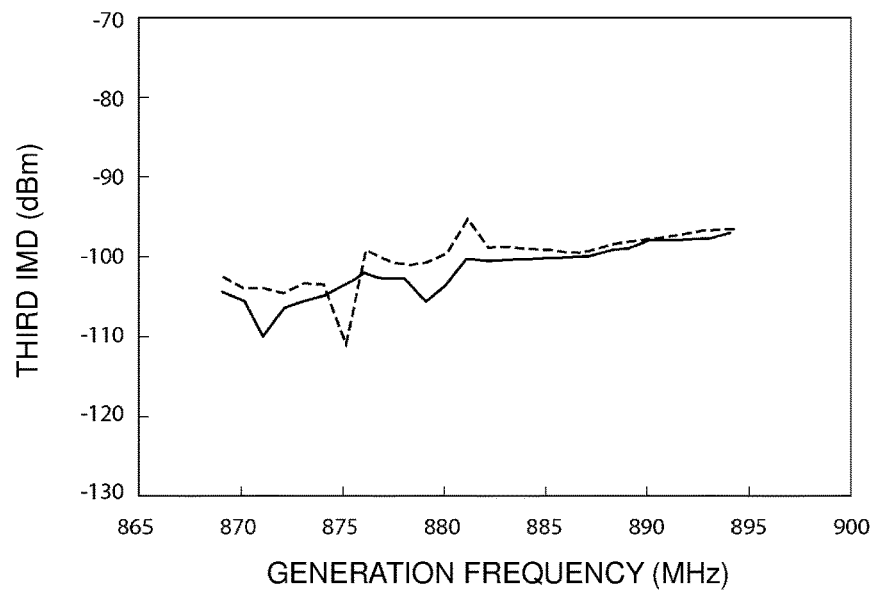
FIG. 7 is a diagram illustrating characteristics of a third IMD of an elastic wave resonator according to the second preferred embodiment of the present invention.

FIG. 7 is a diagram illustrating characteristics of the third IMD of an elastic wave resonator according to the second preferred embodiment. In the drawing, a solid line represents a result with the elastic wave resonator 21 when $W_1/L=0.35$ and $W_2/L=0.55$. A dashed line represents a result with the elastic wave resonator 21 when $W_1/L=W_2/L=0.45$.

From FIG. 7, when $W_1/L=0.35$ and $W_2/L=0.55$, it was discovered that the level of the third IMD (frequency: third IMD in 870 to 895 MHz) was improved by about 1 to 5 dB compared with the standard sample of $W_1/L=W_2/L=0.45$. Although the level of the third IMD deteriorates at 875 MHz compared with the standard sample, this is an effect of a secondary mode and not an essential issue. In terms of peak value, from FIG. 7, it was discovered that the peak level of the third IMD (frequency: near 881 MHz) was improved by about 4 dB compared with the standard sample.

Figure 8:
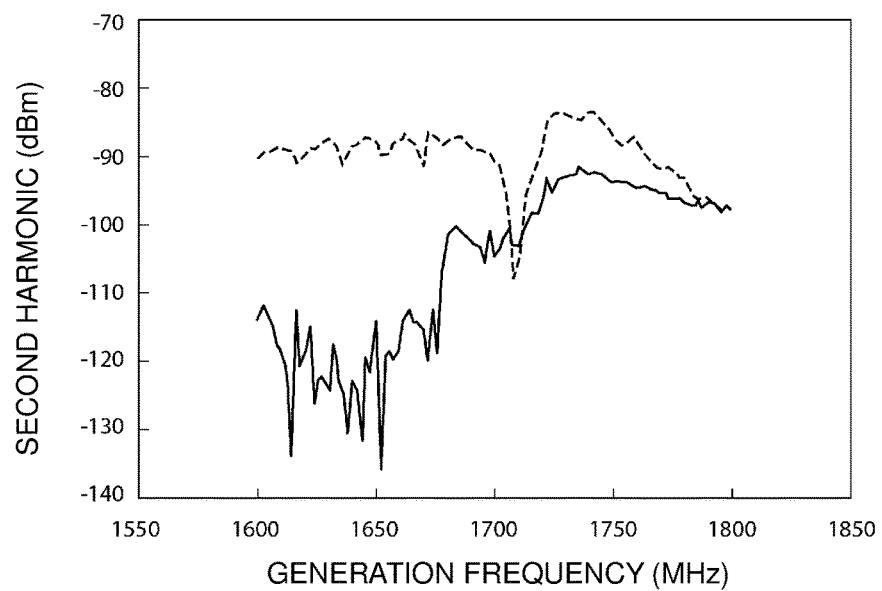
FIG. 8 is a diagram illustrating characteristics of second harmonic of elastic wave resonators according to the first preferred embodiment and the second preferred embodiment of the present invention.

FIG. 8 is a diagram illustrating characteristics of the second harmonic of elastic wave resonators according to the first preferred embodiment and the second preferred embodiment. In the drawing, a solid line represents a result with the elastic wave resonator 21 when $W_1/L=0.35$ and $W_2/L=0.55$. A dashed line represents a result with the elastic wave resonator 1 when $W_1/L=0.35$ and $W_2/L=0.55$.

It was discovered that, in the elastic wave resonator 21, the peak value of second harmonic (frequency: peak value in the range of 1600 to 1800 MHz) was further improved compared with the elastic wave resonator 1. The reason is considered to be that, in the elastic wave resonator 21, the first electrode fingers 3a and the second electrode fingers 3b are connected to the first busbar 3c and the second busbar 3d in a well-balanced manner, thereby improving electrical symmetry.

Figure 9:
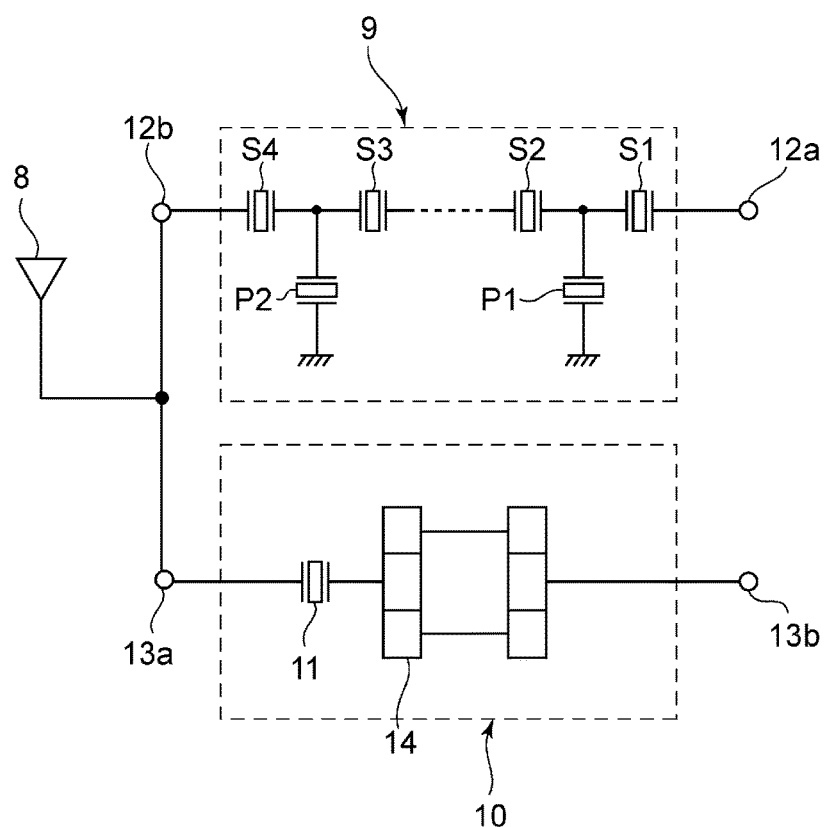
FIG. 9 is a schematic circuit diagram of a duplexer according to a preferred embodiment of the present invention.

FIG. 9 is a schematic circuit diagram of a duplexer according to a preferred embodiment of the present invention. The duplexer according to the present preferred embodiment includes a first filter 9 and a second filter 10, which are connected in common to an antenna 8.

The first filter 9 is a bandpass type transmission filter. The first filter 9 is a ladder type filter. The first filter 9 includes an input terminal 12a defining a transmission terminal and an output terminal 12b.

A plurality of series arm resonators S1 to S4 is arranged along a series arm connecting the input terminal 12a and the output terminal 12b. A parallel arm resonator P1 is connected between a ground potential and a connection point between the series arm resonator S1 and the series arm resonator S2. A parallel arm resonator P2 is connected between the ground potential and a connection point between the series arm resonator S3 and the series arm resonator S4.

The second filter 10 is a reception filter having a passband different from that of the first filter 9. The second filter 10 includes a longitudinally coupled resonator-type elastic wave filter 14.

The second filter 10 includes an input terminal 13a and an output terminal 13b defining as a reception terminal. An elastic wave resonator 11 is connected between the input terminal 13a and the longitudinally coupled resonator-type elastic wave filter 14. The input terminal 13a is connected to the antenna 8 via a common connection point with the output terminal 12b. In the present preferred embodiment, as the filter to be used in each of the first filter and the second filter, a ladder filter, a longitudinally coupled resonator filter, a lattice filter, or other suitable filter may be used.

In the duplexer, when a large non-linear signal is generated at an elastic wave resonator in the transmission filter, noise in a reception band of the reception filter is increased, and this often leads to reduction of the reception sensitivity.

In the present preferred embodiment, all of the resonators in the first filter 9 are preferably defined by the elastic wave resonator 1 according to the first preferred embodiment of the present invention. Accordingly, the generation of a non-linear signal is reduced or prevented at all of the resonators of the first filter 9, and this reduces or prevents an increase in noise in the reception band of the second filter 10. Therefore, in the duplexer according to the present preferred embodiment, deterioration of the reception sensitivity does not substantially occur.

However, in preferred embodiments of the present invention, all that is needed is that, of a plurality of elastic wave resonators defining an elastic wave filter, at least one elastic wave resonator is defined by the elastic wave resonator according to a preferred embodiment of the present invention.

In the duplexer according to the present preferred embodiment, when including a transmission filter and a reception filter, whose passbands are different from each other, all that is required is that at least one of elastic wave resonators of the transmission filter is defined by the elastic wave resonator according to a preferred embodiment of the present invention. This reduces or prevents noise at a reception band of the duplexer and reduces or prevents a decrease in reception sensitivity. From a viewpoint of further reducing or preventing the decrease in reception sensitivity, it is preferable that a resonator directly connected to the second filter serving as a reception filter, such as the series arm resonator S4 in FIG. 9, is defined the elastic wave resonator according to a preferred embodiment of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave resonator comprising:
    a piezoelectric substrate; and
    an IDT electrode provided on the piezoelectric substrate, wherein
    the IDT electrode includes a first electrode finger and a second electrode finger, the second electrode finger being adjacent to the first electrode finger in an elastic wave propagation direction;
    a metallization ratio ($W_1/L$) of the first electrode finger is smaller than a metallization ratio ($W_2/L$) of the second electrode finger; and
    a sum ($W_1/L+W_2/L$) of the metallization ratio of the first electrode finger and the metallization ratio of the second electrode finger is between about 0.65 and about 1.00 inclusive, and a ratio ($W_2/W_1$) between a width of the first electrode finger and a width of the second electrode finger is between about 1.12 and about 2.33 inclusive; or
    the sum ($W_1/L+W_2/L$) of the metallization ratio of the first electrode finger and the metallization ratio of the second electrode finger is larger than about 1.00, and the ratio ($W_2/W_1$) between the width of the first electrode finger and the width of the second electrode finger is between about 1.40 and about 2.34 inclusive;
    where $W_1$ is the width of the first electrode finger along the elastic wave propagation direction, $W_2$ is the width of the second electrode finger along the elastic wave propagation direction, and L is a pitch or an electrode finger center distance between the first electrode finger and the second electrode finger.

2. The elastic wave resonator according to claim 1, wherein
    the sum ($W_1/L+W_2/L$) of the metallization ratio of the first electrode finger and the metallization ratio of the second electrode finger is larger than about 0.70 but equal to or smaller than about 1.00, and the ratio ($W_2/W_1$) between the width of the first electrode finger and the width of the second electrode finger is between about 1.14 and about 2.33 inclusive; or
    the sum ($W_1/L+W_2/L$) of the metallization ratio of the first electrode finger and the metallization ratio of the second electrode finger is larger than about 1.00, and the ratio ($W_2/W_1$) between the width of the first electrode finger and the width of the second electrode finger is between about 1.40 and about 2.34 inclusive.

3. The elastic wave resonator according to claim 1, wherein
    the IDT electrode includes a plurality of the first electrode fingers and a plurality of the second electrode fingers, and the first electrode finger and the second electrode finger are alternately arranged along the elastic wave propagation direction.

4. The elastic wave resonator according to claim 1, wherein
    the IDT electrode includes a plurality of the first electrode fingers and a plurality of the second electrode fingers, and an adjacent pair of the first electrode fingers and an adjacent pair of the second electrode fingers are alternately arranged along the elastic wave propagation direction.

5. The elastic wave resonator according to claim 1, wherein
    the piezoelectric substrate is made of $LiTaO_3$.

6. The elastic wave resonator according to claim 1, wherein
    the IDT electrode is made of at least one of Al, Cu, Ni, Ti, Pt, NiCr, AlCu, or an alloy containing at least one of these metals.

7. An elastic wave filter comprising:
    a plurality of elastic wave resonators; wherein
    of the plurality of elastic wave resonators, at least one elastic wave resonator is the elastic wave resonator according to claim 1.

8. The elastic wave filter according to claim 7, wherein
    the sum ($W_1/L+W_2/L$) of the metallization ratio of the first electrode finger and the metallization ratio of the second electrode finger is larger than about 0.70 but equal to or smaller than about 1.00, and the ratio ($W_2/W_1$) between the width of the first electrode finger and the width of the second electrode finger is between about 1.14 and about 2.33 inclusive; or
    the sum ($W_1/L+W_2/L$) of the metallization ratio of the first electrode finger and the metallization ratio of the second electrode finger is larger than about 1.00, and the ratio ($W_2/W_1$) between the width of the first electrode finger and the width of the second electrode finger is between about 1.40 and about 2.34 inclusive.

9. The elastic wave filter according to claim 7, wherein
the IDT electrode includes a plurality of the first electrode fingers and a plurality of the second electrode fingers, and the first electrode finger and the second electrode finger are alternately arranged along the elastic wave propagation direction.

10. The elastic wave filter according to claim 7, wherein
the IDT electrode includes a plurality of the first electrode fingers and a plurality of the second electrode fingers, and an adjacent pair of the first electrode fingers and an adjacent pair of the second electrode fingers are alternately arranged along the elastic wave propagation direction.

11. The elastic wave filter according to claim 7, wherein
the piezoelectric substrate is made of $LiTaO_3$.

12. The elastic wave filter according to claim 7, wherein
the IDT electrode is made of at least one of Al, Cu, Ni, Ti, Pt, NiCr, AlCu, or an alloy containing at least one of these metals.

13. A duplexer comprising:
a first bandpass filter; and
a second bandpass filter having a passband different from that of the first bandpass filter; wherein
each of the first and second bandpass filters includes at least one elastic wave resonator; and
at least one of the elastic wave resonators in at least one of the first bandpass filter and the second bandpass filter is the elastic wave resonator according to claim 1.

14. The duplexer according to claim 13, wherein
the sum ($W_1/L+W_2/L$) of the metallization ratio of the first electrode finger and the metallization ratio of the second electrode finger is larger than about 0.70 but equal to or smaller than about 1.00, and the ratio ($W_2/W_1$) between the width of the first electrode finger and the width of the second electrode finger is between about 1.14 and about 2.33 inclusive; or
the sum ($W_1/L+W_2/L$) of the metallization ratio of the first electrode finger and the metallization ratio of the second electrode finger is larger than about 1.00, and the ratio ($W_2/W_1$) between the width of the first electrode finger and the width of the second electrode finger is between about 1.40 and about 2.34 inclusive.

15. The duplexer according to claim 13, wherein
the IDT electrode includes a plurality of the first electrode fingers and a plurality of the second electrode fingers, and the first electrode finger and the second electrode finger are alternately arranged along the elastic wave propagation direction.

16. The duplexer according to claim 13, wherein
the IDT electrode includes a plurality of the first electrode fingers and a plurality of the second electrode fingers, and an adjacent pair of the first electrode fingers and an adjacent pair of the second electrode fingers are alternately arranged along the elastic wave propagation direction.

17. The duplexer according to claim 13, wherein
the piezoelectric substrate is made of $LiTaO_3$.

18. The duplexer according to claim 13, wherein
the IDT electrode is made of at least one of Al, Cu, Ni, Ti, Pt, NiCr, AlCu, or an alloy containing at least one of these metals.

19. An elastic wave resonator comprising:
a piezoelectric substrate; and
an IDT electrode provided on the piezoelectric substrate; wherein
the IDT electrode includes a first electrode finger and a second electrode finger, the second electrode finger being adjacent to the first electrode finger in an elastic wave propagation direction;
W1 is a width of the first electrode finger along the elastic wave propagation direction, W2 is a width of the second electrode finger along the elastic wave propagation direction, L is a pitch or an electrode finger center distance between the first electrode finger and the second electrode finger, W1/L is a metallization ratio of the first electrode finger, and W2/L is a metallization ratio of the second electrode finger; and
a coordinate {W2/L, W1/L} is within an area including a periphery that is a line connecting from coordinate (1) to coordinate (17) in order:
(1) W1/L=0.3, W2/L=0.35
(2) W1/L=0.3, W2/L=0.4
(3) W1/L=0.3, W2/L=0.45
(4) W1/L=0.3, W2/L=0.5
(5) W1/L=0.3, W2/L=0.55
(6) W1/L=0.3, W2/L=0.6
(7) W1/L=0.3, W2/L=0.7
(8) W1/L=0.35, W2/L=0.7
(9) W1/L=0.4, W2/L=0.7
(10) W1/L=0.45, W2/L=0.7
(11) W1/L=0.5, W2/L=0.7
(12) W1/L=0.4, W2/L=0.6
(13) W1/L=0.45, W2/L=0.55
(14) W1/L=0.4, W2/L=0.5
(15) W1/L=0.35, W2/L=0.45
(16) W1/L=0.35, W2/L=0.4
(17) W1/L=0.3, W2/L=0.35.

* * * * *